(12) United States Patent
Watanabe

(10) Patent No.: US 6,893,802 B2
(45) Date of Patent: May 17, 2005

(54) METHOD OF FORMING PATTERNED THIN FILM AND METHOD OF FABRICATING MICRO DEVICE

(75) Inventor: Hisayoshi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 305 days.

(21) Appl. No.: 10/157,891

(22) Filed: May 31, 2002

(65) Prior Publication Data

US 2002/0187430 A1 Dec. 12, 2002

(30) Foreign Application Priority Data

Jun. 12, 2001 (JP) .................................. 2001-176886

(51) Int. Cl.⁷ .............................. G03F 7/00; G03F 7/34
(52) U.S. Cl. ........................ 430/313; 430/311; 430/5; 430/256; 430/319; 430/323; 430/329
(58) Field of Search .................... 430/311, 313, 430/319, 256, 5, 323, 329

(56) References Cited

U.S. PATENT DOCUMENTS

| | | |
|---|---|---|
| 5,721,078 A | 2/1998 | Kamijima |
| 5,725,997 A | 3/1998 | Kamijima |
| 5,747,198 A | 5/1998 | Kamijima |
| 5,773,200 A | 6/1998 | Okazaki et al. |
| 6,383,944 B1 * | 5/2002 | Furihata et al. ............. 438/725 |

FOREIGN PATENT DOCUMENTS

| | | |
|---|---|---|
| EP | 0 341 843 A2 | 11/1989 |
| JP | A 2-17643 | 1/1990 |
| JP | A 8-69111 | 3/1996 |
| JP | A 9-96909 | 4/1997 |

* cited by examiner

*Primary Examiner*—Amanda Walke
(74) *Attorney, Agent, or Firm*—Oliff & Berridge, PLC

(57) ABSTRACT

In a method of forming a patterned thin film, a first film to be patterned and a peelable film are sequentially formed on a base layer, and an undercut mask is then formed thereon. Then, using of the mask, the peelable film and the first film to be patterned are etched selectively to form a first patterned thin film. During the etching, a substance that forms the first film to be patterned deposits to form a deposition film on the peelable film. Then, a film to be patterned is formed over the entire surface. During the formation, a substance that forms the film to be patterned deposits to form another deposition film on the peelable film. The mask and the peelable film are then peeled off to remove the deposition films together.

12 Claims, 14 Drawing Sheets

METHOD OF FORMING PATTERNED THIN FILM AND METHOD OF FABRICATING MICRO DEVICE

BACKGROUND OF THE INVENTION

1. Field of the Invention

The present invention relates to a method of forming a patterned thin film and a method of fabricating a micro device in which a patterned thin film is formed through the use of an undercut mask.

2. Description of the Related Art

As disclosed in Published Unexamined Japanese Patent Application (KOKAI) No. Heisei 9-96909 (1997), for example, methods such as etching, liftoff, and a combination of etching and liftoff (hereinafter called a combination method) are available to form a patterned thin film on a base layer by using a patterned resist layer as a mask.

To perform the aforementioned methods, an undercut mask is preferably used. An undercut mask means a mask whose width at the bottom is smaller than the width at the top. Known methods of forming such a mask include those using a two-layer resist, using a resist having an image reversal function, and utilizing a micro-groove, as disclosed in Published Unexamined Japanese Patent Application (KOKAI) Nos. Heisei 2-17643 (1990), 9-96909 (1997), and 8-69111 (1996), respectively.

The method of forming an undercut mask using a two-layer resist will now be briefly described. According to this method, first, a first layer and a second layer are sequentially formed on a base layer. The second layer is made of a resist, while the first layer is made of a material that dissolves in a developing solution. Then, the second layer is exposed to specifically patterned image radiation. After the exposure, the second layer is developed and part of the first layer is dissolved in a developing solution to make the first layer smaller in width than the second layer. Thus, the patterned first and second layers make up an undercut mask.

Next, the method of forming an undercut mask using a resist having an image reversal function will be briefly described. According to this method, first, a resist layer of a resist having an image reversal function is formed on a base layer. The resist having an image reversal function is a positive resist whose portion that has become soluble in a developing solution by being exposed to radiation turns insoluble in the developing solution by being heated. Then, the resist layer is exposed to specifically patterned image radiation. Subsequently, the resist layer is heated so that the portion thereof that has become soluble in a developing solution by being exposed to the radiation turns insoluble in the developing solution. The entire surface of the resist layer is then exposed to radiation so that portions of the resist layer other than the portion having been exposed to the first radiation become soluble in the developing solution. The resist layer is then developed. Thus, the portion of the resist layer that has been exposed to the first radiation only remains. This portion serves as an undercut mask.

Next, the method of forming an undercut mask by utilizing a micro-groove will be briefly described. A micro-groove is a phenomenon in which a patterned resist layer is deformed such that the width at the bottom thereof becomes smaller than the width at the top thereof. According to this method, first, formed on a base layer is a resist layer containing an acid-generating agent for generating an acid through exposure to radiation, the acid being soluble in a developing solution. The resist layer is exposed to specifically patterned image radiation. Subsequently, the resist layer is heated so that the acid that has been generated through the exposure segregates to a region of the resist layer closer to the base layer. The resist layer is then developed. This forms a patterned resist layer in which a micro-groove has been developed, and this patterned resist layer serves as an undercut mask.

Reference is now made to FIGS. 30 to 33 to describe a method of forming a patterned thin film by means of etching through the use of an undercut mask. According to this method, as shown in FIG. 30, a film 302 to be patterned is first formed on a base layer 301. Then, as shown in FIG. 31, an undercut mask 303 is formed on the film 302 to be patterned. Then, as shown in FIG. 32, the film 302 is selectively etched by dry etching such as ion milling through the use of the mask 303, to thereby form a patterned thin film 304 in a desired shape. Then, as shown in FIG. 33, the mask 303 is peeled off.

Now, reference is made to FIGS. 34 to 38 to describe a method of forming a patterned thin film by means of the combination method through the use of an undercut mask. According to this method, as shown in FIG. 34, a first film 312 to be patterned is first formed on a base layer 311. Then, as shown in FIG. 35, an undercut mask 313 is formed on the first film 312 to be patterned. Then, as shown in FIG. 36, the first film 312 to be patterned is selectively etched by dry etching such as ion milling through the use of the mask 313, to thereby form a first patterned thin film 314 in a desired shape. Then, as shown in FIG. 37, a second film 316 to be patterned is formed by sputtering to cover the base layer 311 and the mask 313. Then, as shown in FIG. 38, the mask 313 is peeled off. A second patterned thin film 318 in a desired shape is thereby obtained. According to the combination method, the first patterned thin film 314 and the second patterned thin film 318 can be formed so as to be adjacent to each other on the base layer 311.

On the other hand, forming a patterned thin film by the etching or the combination method using an undercut mask causes the following problems.

For the case of employing etching, when the film 302 to be patterned is being selectively etched by using the mask 303 as shown in FIG. 32, a substance that forms the film 302 separates from the film 302 due to the etching. The substance then deposits on the patterned thin film 304 in the area around the bottom of the mask 303, thereby forming a deposition film 305. The deposition film 305 can cause burrs, as shown in FIG. 33, on the patterned thin film 304 after the mask 303 has been peeled off. The burrs may result in defects of the patterned thin film 304, thereby causing a reduction in the yield of products such as micro devices that include the patterned thin film 304 or an increase in the lead time in product fabrication. A micro device means a small-size device fabricated through the use of thin-film forming techniques. Examples of the micro device include semiconductor devices, thin-film magnetic heads, and sensors and actuators incorporating thin films.

On the other hand, for the case of employing the combination method, when the first film 312 to be patterned is being selectively etched by using the mask 313, a substance that forms the film 312 separates from the film 312 due to the etching. The substance then deposits on the first patterned thin film 314 in the area around the bottom of the mask 313, thereby forming a deposition film 315 as shown in FIG. 36. Further, as shown in FIG. 37, during the sputtering to form the second film 316 to be patterned, the substance for forming the film 316 also reaches the area around the bottom of the mask 313 and deposits on the first patterned thin film 314, thereby forming a deposition film 317. The deposition films 315 and 317 can cause burrs, as shown in FIG. 38, on the first patterned thin film 314 after the mask 313 has been peeled off. The burrs may result in defects of the first patterned thin film 314, thereby causing a reduction in the yield of products such as micro devices that include the first patterned thin film 314 or an increase in the lead time in product fabrication.

As described above, the conventional methods of forming a patterned thin film by means of etching or the combination method using an undercut mask may cause defects in the patterned thin film.

SUMMARY OF THE INVENTION

It is therefore an object of the invention to provide a method of forming a patterned thin film and a method of fabricating a micro device which make it possible to form a patterned thin film through the use of an undercut mask without causing defects.

The invention provides a first method of forming a patterned thin film through the use of an undercut mask, the method comprising the steps of: forming a film to be patterned on a base layer; forming a peelable film on the film to be patterned, the peelable film being to be patterned later together with the film to be patterned, and to be eventually peeled off; forming the undercut mask on the peelable film; forming a patterned thin film from the film to be patterned, by patterning the film to be patterned and the peelable film by selective etching through the use of the undercut mask; and peeling off the undercut mask and the peelable film.

According to the first method of forming a patterned thin film of the invention, the peelable film is formed on the film to be patterned, and the undercut mask is formed on the peelable film. Accordingly, when selectively etching the peelable film and the film to be patterned through the use of the mask, a substance that forms the film to be patterned deposits to form a deposition film on the peelable film in the area around the bottom of the mask. The deposition film is removed together with the peelable film.

In the first method of forming a patterned thin film of the invention, the peelable film may be formed of a resin.

The invention also provides a second method of forming a patterned thin film through the use of an undercut mask, the method comprising the steps of: forming a first film to be patterned on a base layer; forming a peelable film on the first film to be patterned, the peelable film being to be patterned later together with the first film to be patterned, and to be eventually peeled off; forming the undercut mask on the peelable film; forming a first patterned thin film from the first film to be patterned, by patterning the first film to be patterned and the peelable film by selective etching through the use of the undercut mask; forming a second film to be patterned to cover the base layer and the undercut mask, to thereby form a second patterned thin film from the second film to be patterned on the base layer; and peeling off the undercut mask and the peelable film.

According to the second method of forming a patterned thin film of the invention, the peelable film is formed on the first film to be patterned, and the undercut mask is formed on the peelable film. During selective etching of the peelable film and the first film to be patterned through the use of the mask, a substance that forms the first film to be patterned deposits to form a deposition film on the peelable film in the area around the bottom of the mask. On the other hand, during formation of the second film to be patterned to cover the base layer and the mask, a substance for forming the second film to be patterned reaches the area around the bottom of the mask and deposits to form a deposition film on the peelable film in the area around the bottom of the mask. Those deposition films are removed together with the peelable film.

In the second method of forming a patterned thin film of the invention, the peelable film may be formed of a resin.

The invention also provides a method of fabricating a micro device including one or more patterned thin films, in which the patterned thin films are formed by the above-mentioned first or second method of forming a patterned thin film according to the invention.

In the method of fabricating a micro device of the invention, the micro device may be a thin-film magnetic head. In this case, the patterned thin film may be a magnetoresistive element.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings.

To begin with, a method of forming a patterned thin film according to an embodiment of the invention will now be described. FIGS. 1 to 6 are cross sections for illustrating steps in the method of forming a patterned thin film according to the embodiment. The following description deals with the case of forming first and second patterned thin films by means of a combination method. In the following description, by way of example, the first patterned thin film is a magnetoresistive element for a read head of a thin-film magnetic head, and the second patterned thin films are bias field applying layers for applying a bias magnetic field to the magnetoresistive element. For example, the magnetoresistive element is a spin-valve GMR element. The bias field applying layers are hard magnetic layers (hard magnets), for example.

Figure 1:
FIG. 1 is a cross section for illustrating a step in a method of forming a patterned thin film according to an embodiment of the invention.

According to the method of forming a patterned thin film of the embodiment, as shown in FIG. 1, a first film 102 to be patterned is first formed by sputtering on a base layer 101 such as an insulating layer.

Figure 2:
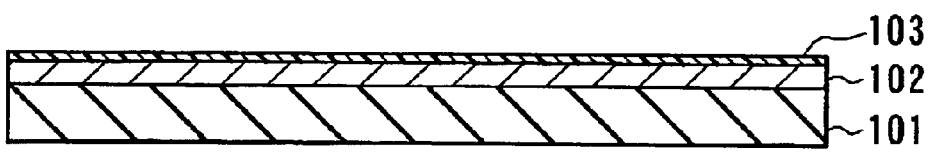
FIG. 2 is a cross section for illustrating a step that follows FIG. 1.

Then, as shown in FIG. 2, a peelable film 103 is formed on the first film 102 to be patterned. The peelable film 103 is to be patterned later together with the film 102, and is to be eventually peeled off. The peelable film 103 is made of a material that is undissolvable in a solvent used for a resist for forming a mask 104 to be described later, insensitive to the light for exposure for forming the mask 104, and readily peelable from the film 102. For example, the material of the peelable film 103 may be a resin. To form the peelable film 103, for example, the film 102 is coated with a resin using a coating apparatus such as a spin coater, and then the resin is subjected to a heat treatment (baking).

For example, the resin to be used for the peelable film 103 may be a derivative of a polysulfone polymer or a derivative of a maleimide vinyl copolymer. A derivative of a polysulfone polymer has the following chemical formula:

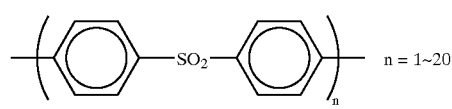

A derivative of a maleimide vinyl copolymer has the following chemical formula:

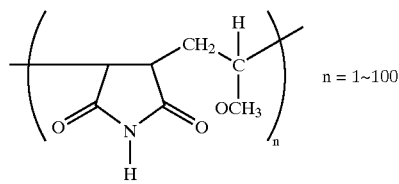

Figure 3:
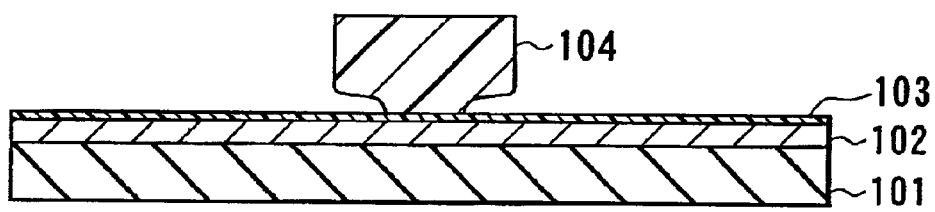
FIG. 3 is a cross section for illustrating a step that follows FIG. 2.

Next, as shown in FIG. 3, an undercut mask 104 is formed on the peelable film 103. The shape of the mask 104 as viewed from above corresponds to the shape of a first patterned thin film to be formed. A method of forming the mask 104 will be described later in detail.

Figure 4:
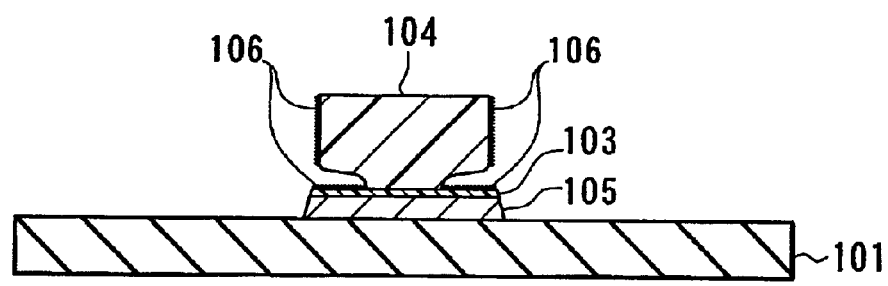
FIG. 4 is a cross section for illustrating a step that follows FIG. 3.

Then, as shown in FIG. 4, the peelable film 103 and the film 102 are selectively etched by dry etching such as ion milling through the use of the mask 104, to thereby pattern the films 103 and 102 at the same time into desired shapes. The film 102 thus patterned makes the first patterned thin film 105.

During the selective etching of the films 103 and 102 using the mask 104, a substance that forms the film 102 separates from the film 102 due to the etching. The substance then deposits on sidewalls of the mask 104 and on the peelable film 103 in the area around the bottom of the mask 104, thereby forming a deposition film 106.

Figure 5:
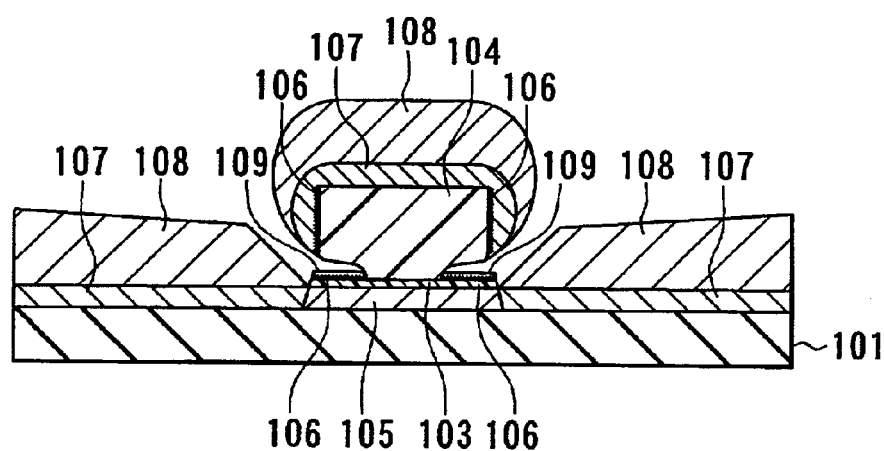
FIG. 5 is a cross section for illustrating a step that follows FIG. 4.

Then, as shown in FIG. 5, a second film 107 to be patterned and a third film 108 to be patterned are sequentially formed by sputtering to cover the base layer 101 and the mask 104. During the sputtering, substances for forming the second and third films 107 and 108 also reach the area around the bottom of the mask 104 and deposit on the peelable film 103 and/or the deposition film 106, thereby forming a deposition film 109.

Figure 6:
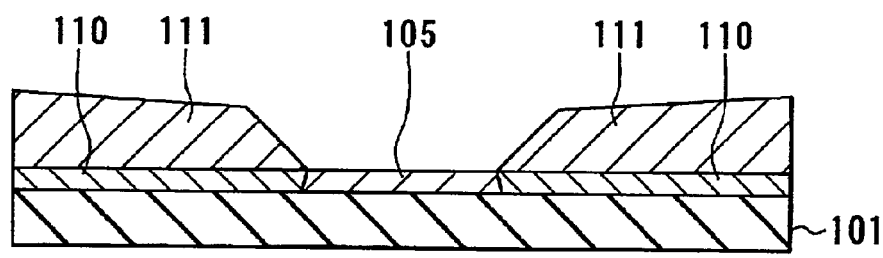
FIG. 6 is a cross section for illustrating a step that follows FIG. 5.

Then, as shown in FIG. 6, the mask 104 and the peelable film 103 are peeled off with an organic solvent or the like. This allows the remaining portions of the second film 107 to form second patterned thin films 110 in a desired shape, and the remaining portions of the third film 108 to form third patterned thin films 111 in a desired shape. When the mask 104 and the film 103 are peeled off, the deposition films 106 and 109 are removed together with the film 103.

In the example shown in FIG. 6, the first patterned thin film 105 is a magnetoresistive element, while the second patterned thin films 110 are bias field applying layers. The third patterned thin films 111 are lead layers for feeding a current for signal detection to the magnetoresistive element. As shown in FIGS. 1 to 6, the use of the combination method makes it possible to form the bias field applying layers (the second patterned thin films 110) and the lead layers (the third patterned thin films 111) so as to be located precisely next to both sides of the magnetoresistive element (the first patterned thin film 105). Such a structure is referred to as an abutted junction.

In the foregoing, formation of the first patterned thin film 105 and the second patterned thin films 110 by means of the combination method has been described. However, the method of forming a patterned thin film according to this embodiment is also applicable to the case of forming a patterned thin film only by etching. To form a patterned thin film only by etching, subsequent to the step shown in FIG. 4, the mask 104 and the peelable film 103 are peeled off with an organic solvent or the like. In this case, the first film 102 to be patterned corresponds to the film to be patterned according to the invention, while the first patterned thin film 105 corresponds to the patterned thin film according to the invention. Thus, in the case of forming a patterned thin film only by etching, the deposition film 106 on the peelable film 103 is removed together with the film 103.

As described above, in the embodiment, the peelable film 103 is formed on the first film 102 to be patterned, and the undercut mask 104 is formed on the peelable film 103. During the selective etching of the film 102 using the mask 104, a substance that forms the film 102 deposits to form the deposition film 106 on the peelable film 103 in the area around the bottom of the mask 104. On the other hand, during the formation of the second and third films 107 and 108 so as to cover the base layer 101 and the mask 104, substances for forming the films 107 and 108 reach the area around the bottom of the mask 104 to form the deposition film 109 on the peelable film 103 in the area around the bottom of the mask 104. Those deposition films 106 and 109 are removed together with the peelable film 103. Therefore, the deposition films 106 and 109 would not cause burrs on the first patterned thin film 105.

Thus, the embodiment makes it possible to form the patterned thin films 105, 110 and 111 through the use of the undercut mask 104 without causing defects. This in turn makes it possible to improve the yield of products such as micro devices that incorporate the patterned thin films 105, 110 and 111, and reduce the lead time in product fabrication.

Now, three examples of method of forming the undercut mask 104 according to the embodiment will be described.

Figure 7:
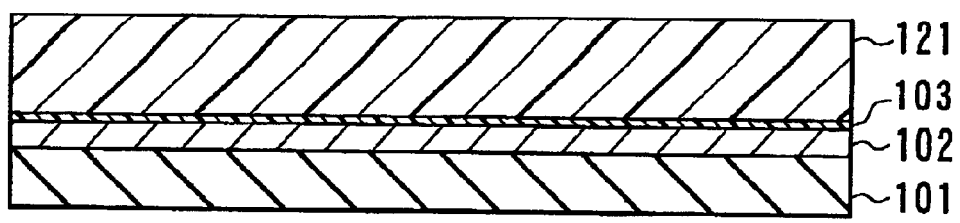
FIG. 7 is a cross section for illustrating a step in a method of forming an undercut mask by utilizing a micro-groove in the embodiment of the invention.
Figure 8:
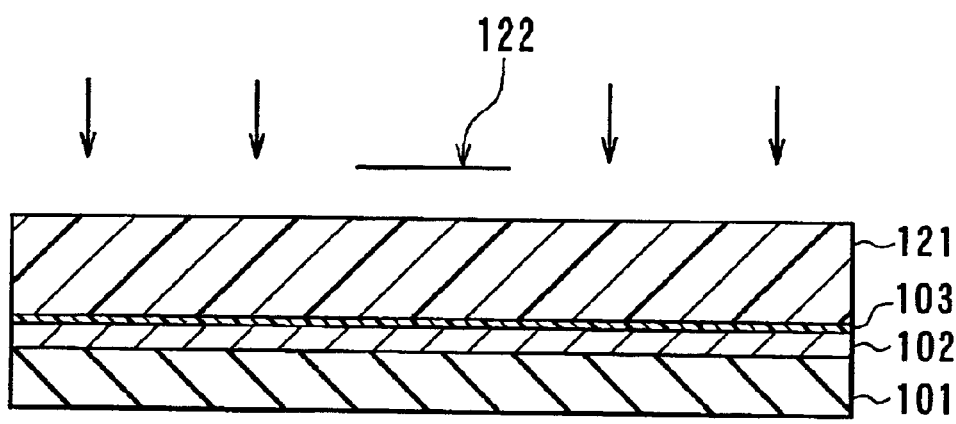
FIG. 8 is a cross section for illustrating a step that follows FIG. 7.
Figure 9:
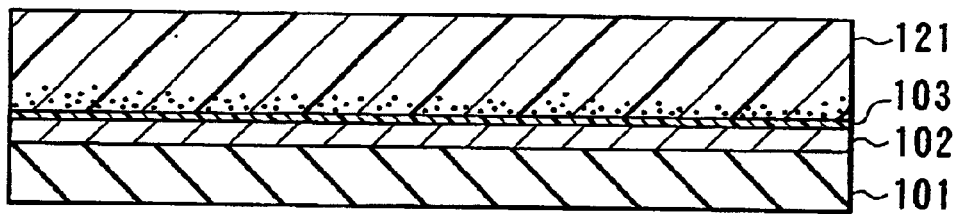
FIG. 9 is a cross section for illustrating a step that follows FIG. 8.
Figure 10:
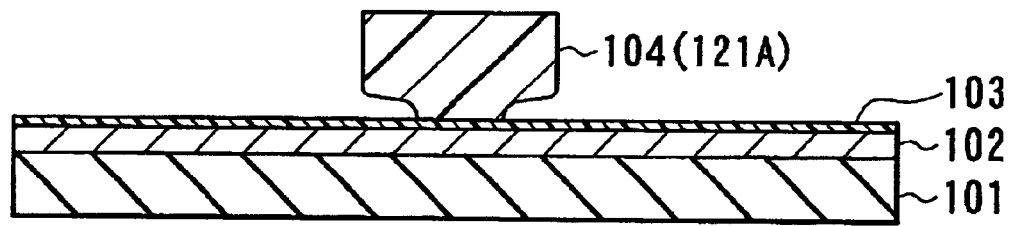
FIG. 10 is a cross section for illustrating a step that follows FIG. 9.

First, a method of forming the undercut mask 104 by utilizing a micro-groove is described with reference to FIGS. 7 to 10. In this method, as shown in FIG. 7, a positive resist layer 121 is formed on the peelable film 103. The resist layer 121 contains an acid-generating agent for generating an acid through exposure to radiation, the acid being soluble in a developing solution. The resist layer 121 may be made of a variety of resist materials disclosed in Published Unexamined Japanese Patent Application (KOKAI) Heisei 8-69111 (1996), for example. Then, as shown in FIG. 8, the resist layer 121 is exposed to specifically patterned image radiation using a mask 122 so that portions of the resist layer 121 other than the portion corresponding to the mask 104 to be formed are exposed to the radiation. Then, as shown in FIG. 9, the resist layer 121 is heated to allow the acid that has been generated through the exposure to the radiation to segregate to a region of the resist layer 121 closer to the base layer 101. Then, as shown in FIG. 10, the resist layer 121 is developed to form a patterned resist layer 121A in which a micro-groove has been developed. The patterned resist layer 121A makes the undercut mask 104.

Figure 11:
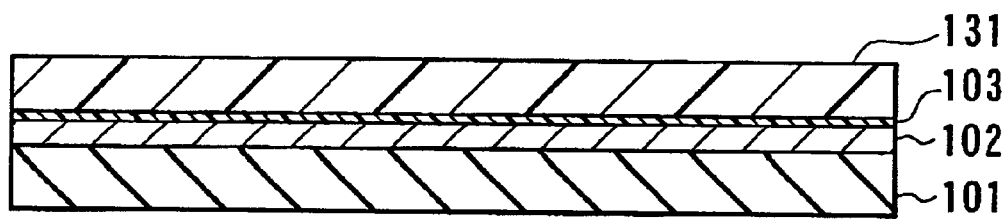
FIG. 11 is a cross section for illustrating a step in a method of forming an undercut mask through the use of a two-layer resist in the embodiment of the invention.
Figure 12:
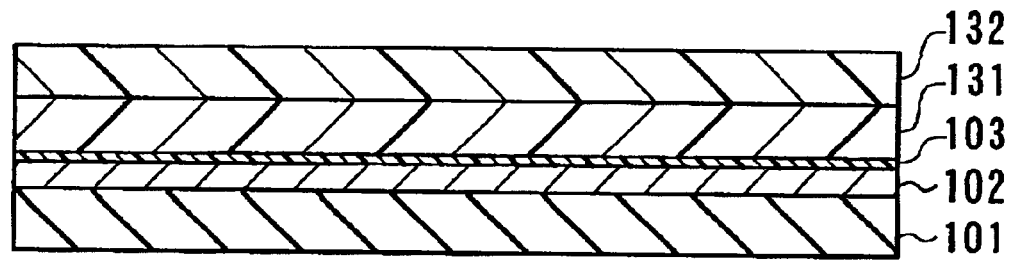
FIG. 12 is a cross section for illustrating a step that follows FIG. 11.
Figure 13:
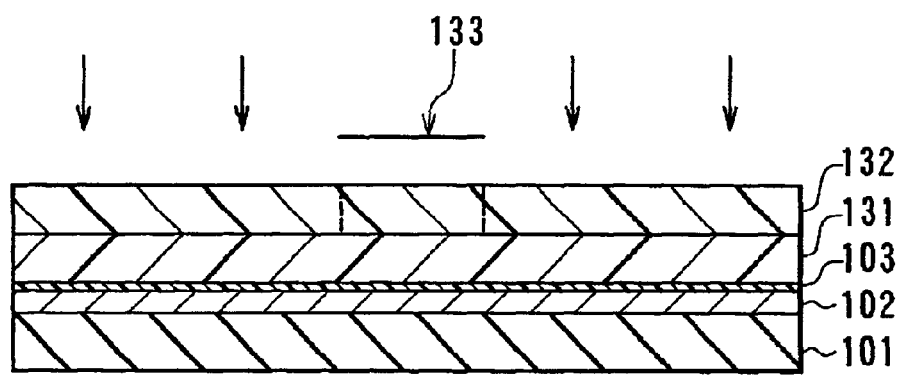
FIG. 13 is a cross section for illustrating a step that follows FIG. 12.
Figure 14:
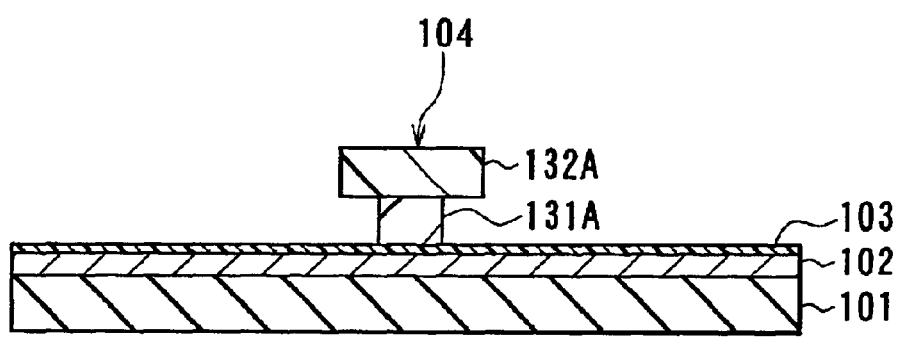
FIG. 14 is a cross section for illustrating a step that follows FIG. 13.

Next, a method of forming the undercut mask 104 using a two-layer resist is described with reference to FIGS. 11 to 14. In this method, as shown in FIG. 11, a first layer 131 is formed on the peelable film 103. The first layer 131 is made of a material that dissolves in a developing solution. For example, the material of the first layer 131 is polymethylglutarimide, or polymethylglutarimide to which a dye is added. To form the first layer 131, for example, the material of the first layer 131 is applied to the peelable film 103 and then heat-treated. Then, as shown in FIG. 12, a second layer 132 of a positive resist is formed on the first layer 131. To form the second layer 132, for example, the resist as the material of the second layer 132 is applied to the first layer 131 and then heat-treated. Next, as shown in FIG. 13, the second layer 132 is exposed to specifically patterned image radiation using a mask 133 so that portions of the second layer 132 other than the portion corresponding to the mask 104 to be formed are exposed to the radiation. After the exposure, the second layer 132 is developed and part of the first layer 131 is dissolved in the developing solution, thereby forming a first patterned layer 131A and a second patterned layer 132A as shown in FIG. 14. The first patterned layer 131A is smaller in width than the second patterned layer 132A. The first patterned layer 131A and the second patterned layer 132A make up the undercut mask 104.

Figure 15:
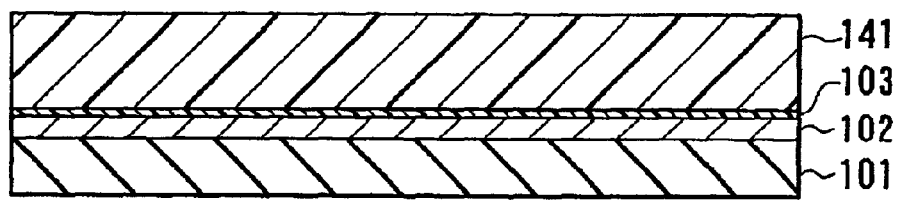
FIG. 15 is a cross section for illustrating a step in a method of forming an undercut mask through the use of a resist having an image reversal function in the embodiment of the invention.
Figure 16:
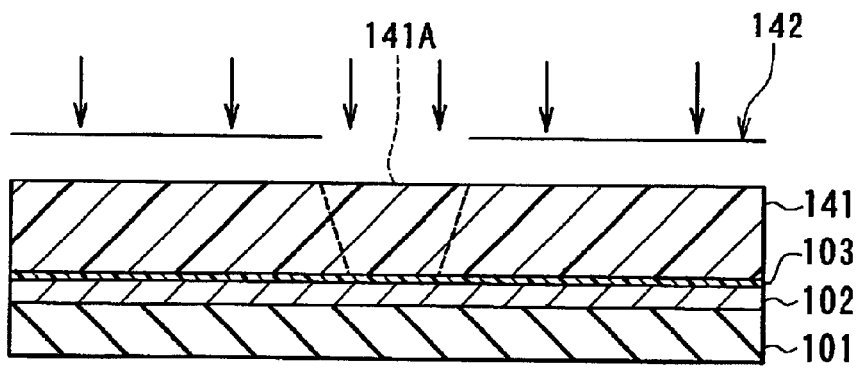
FIG. 16 is a cross section for illustrating a step that follows FIG. 15.
Figure 17:
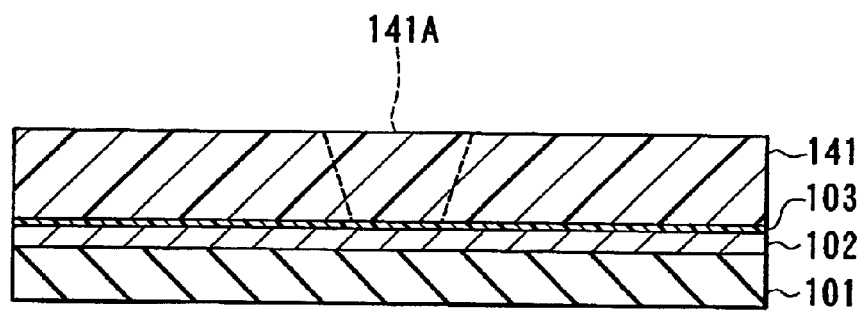
FIG. 17 is a cross section for illustrating a step that follows FIG. 16.
Figure 18:
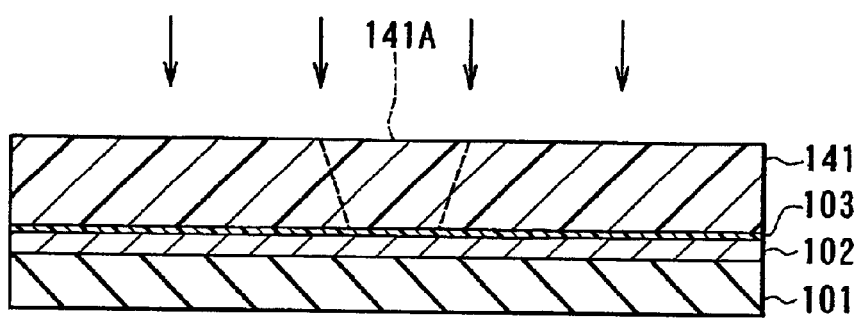
FIG. 18 is a cross section for illustrating a step that follows FIG. 17.
Figure 19:
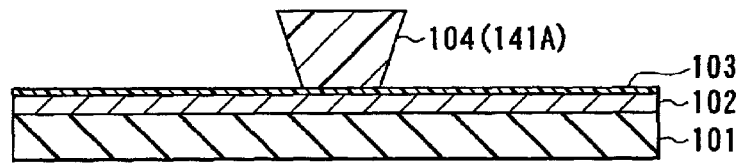
FIG. 19 is a cross section for illustrating a step that follows FIG. 18.

Next, a method of forming the undercut mask 104 through the use of a resist having an image reversal function is described with reference to FIGS. 15 to 19. According to this method, as shown in FIG. 15, a resist layer 141 made of a resist having an image reversal function is formed on the peelable film 103. The resist having an image reversal function refers to a positive resist whose portion that has become soluble in a developing solution by being exposed to radiation turns insoluble in the developing solution by being heated. The resist layer 141 may be made of a variety of resist materials disclosed in Published Unexamined Japanese Patent Application (KOKAI) Heisei 9-96909 (1997), for example. Then, as shown in FIG. 16, the resist layer 141 is exposed to specifically patterned image radiation using a mask 142 so that only a portion 141A of the resist layer 141 that corresponds to the mask 104 to be formed is exposed to the radiation. Then, as shown in FIG. 17, the resist layer 141 is heated to allow the portion 141A that has become soluble in a developing solution by being exposed to the radiation to turn insoluble in the developing solution. Then, as shown in FIG. 18, the entire surface of the resist layer 141 is exposed to radiation so that portions of the resist layer 141 other than the portion 141A that has been exposed to the first radiation become soluble in the developing solution. Then, as shown in FIG. 19, the resist layer 141 is developed. This causes only the portion 141A that has been exposed to the first radiation to remain. The portion 141A makes the undercut mask 104.

Reference is now made to FIGS. 20A to 25A and 20B to 25B to describe an example in which the method of forming a patterned thin film according to the embodiment is applied to a method of fabricating a thin-film magnetic head, an example of micro devices. In this example, described is a thin-film magnetic head that comprises a read head incorporating a spin valve GMR element. FIGS. 20A to 25A are cross sections each orthogonal to an air bearing surface of the thin-film magnetic head, while FIGS. 20B to 25B are cross sections of pole portions of the head each parallel to the air bearing surface.

Figure 20A:
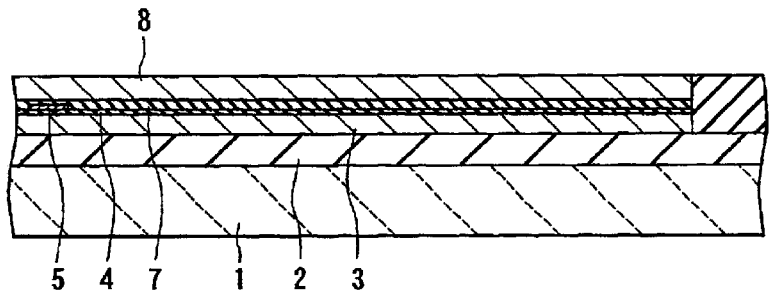
FIGS. 20A and 20B are cross sections for illustrating a method of fabricating a thin-film magnetic head according to the embodiment of the invention.
Figure 20B:
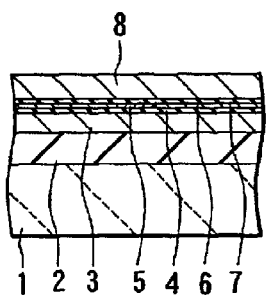

In the method of manufacturing a thin-film magnetic head of this example, as shown in FIGS. 20A and 20B, an insulating layer 2 of an insulating material such as alumina ($Al_2O_3$) is formed to a thickness of 1 to 5 μm, for example, by sputtering or the like on a substrate 1 of a ceramic material such as aluminum oxide and titanium carbide ($Al_2O_3$—TiC). On the insulating layer 2, a bottom shield layer 3 of a magnetic material such as Permalloy (NiFe) is formed to a thickness of about 3 μm, for example, by sputtering or plating or the like, for making the read head.

On the bottom shield layer 3, a bottom shield gap film 4 of an insulating material such as alumina is formed to a thickness of 10 to 200 nm, for example, by sputtering or the like. Then, using the method of forming a patterned thin film according to the embodiment, a GMR element 5 for reading operations, bias field applying layers (not shown), and lead layers 6 are each formed to a thickness of tens of nanometers on the bottom shield gap film 4. The GMR element 5 corresponds to the first patterned thin film 105 of the embodiment, the bias field applying layers correspond to the second patterned thin films 110 of the embodiment, and the lead layers 6 correspond to the third patterned thin films 111 of the embodiment. Accordingly, the positional relationship among the GMR element 5, the bias field applying layers and the lead layers 6 is the same as that among the first patterned thin film 105, the second patterned thin films 110 and the third patterned thin films 111 shown in FIG. 6. The method of forming the GMR element 5, the bias field applying layers and the lead layers 6 is as explained with reference to FIGS. 1 to 6.

On the bottom shield gap film 4 and the GMR element 5, a top shield gap film 7 of an insulating material such as alumina is formed to a thickness of 10 to 200 nm, for example, by sputtering or the like.

On the top shield gap film 7, a top-shield-layer-cum-bottom-pole-layer (hereinafter called a bottom pole layer) 8 is formed to a thickness of 3 to 4 μm, for example, by sputtering or plating or the like. The bottom pole layer 8 is made of a magnetic material and used for both read head and write head. The magnetic material used for the bottom pole layer 8 is a soft magnetic material such as NiFe, CoFe, CoFeNi, and FeN.

In place of the bottom pole layer 8, there may be provided a top shield layer, a separation layer made of a non-magnetic material such as alumina and formed on the top shield layer by sputtering or the like, and a bottom pole layer formed on the separation layer.

Figure 21A:
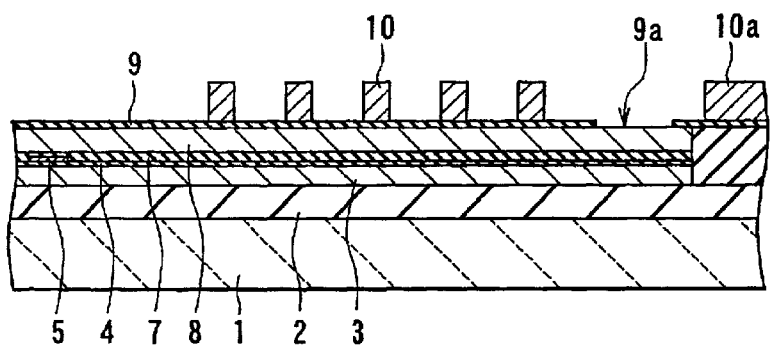
FIGS. 21A and 21B are cross sections for illustrating a step that follows FIGS. 20A and 20B.
Figure 21B:
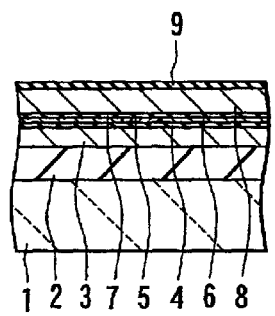

Next, as shown in FIG. 21A and FIG. 21B, a write gap layer 9 of an insulating material such as alumina is formed on the bottom pole layer 8 to a thickness of 50 to 300 nm, for example, by sputtering or the like. Then, a portion of the write gap layer 9 located in the center portion of a thin-film coil to be described later is etched to form a contact hole 9a for making a magnetic path.

On the write gap layer 9, a first layer 10 of the thin-film coil made of copper (Cu), for example, is formed to a thickness of 2 to 3 μm, for example. In FIG. 21A, reference numeral 10a represents a connecting portion of the first layer 10 to be connected to a second layer 15 of the thin-film coil described later. The first layer 10 of the coil is wound around the contact hole 9a.

Figures 22A, 22B:
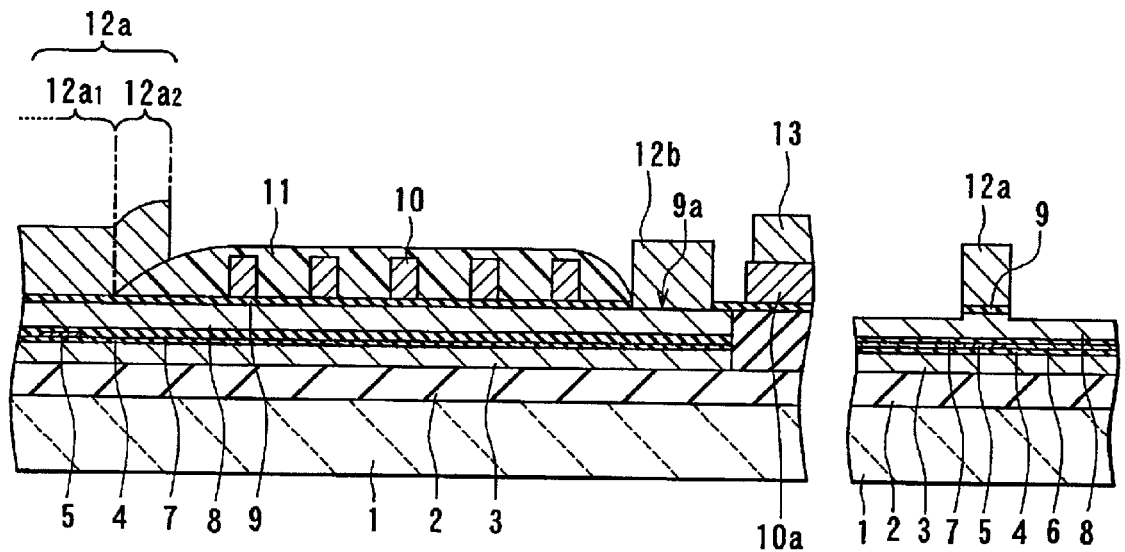
FIGS. 22A and 22B are cross sections for illustrating a step that follows FIGS. 21A and 21B.

Next, as shown in FIGS. 22A and 22B, an insulating layer 11 is formed in a predetermined pattern to cover the first layer 10 of the coil and portions of the write gap layer 9 around the same. The insulating layer 11 is made of an organic insulating material which exhibits fluidity when heated, such as photoresist. Heat treatment is then performed at a predetermined temperature to flatten the surface of the insulating layer 11. As a result of the heat treatment, each of the outer and inner circumferential ends of the insulating layer 11 has a rounded and inclined surface configuration.

On the write gap layer 9 and the insulating layer 11, a track width defining layer 12a of a top pole layer 12 is formed using a magnetic material for making a write head. The track width defining layer 12a extends from an inclined portion of the insulating layer 11 on a side of an air bearing surface 20 (the left side of FIG. 22A) to be described later to the air bearing surface 20. The top pole layer 12 is made up of the track width defining layer 12a, and a coupling portion layer 12b and a yoke portion layer 12c to be described later. The track width defining layer 12a is formed by plating, for example.

The track width defining layer 12a has an end portion $12a_1$ and a connecting portion $12a_2$. The end portion $12a_1$ is formed on the write gap layer 9 and serves as the magnetic pole portion of the top pole layer 12. The connecting portion $12a_2$ is formed on the inclined portion of the insulating layer 11 on the side of the air bearing surface 20 and is connected to the yoke portion layer 12c. The width of the end portion $12a_1$ is equal to the write track width. That is, the end portion $12a_1$ defines the write track width. The width of the connecting portion $12a_2$ is greater than that of the end portion $12a_1$.

Concurrently with the formation of the track width defining layer 12a, the coupling portion layer 12b is formed on the contact hole 9a and a connecting layer 13 is formed on the connecting portion 10a. The coupling portion layer 12b is made of a magnetic material and constitutes a portion of the top pole layer 12 that is magnetically coupled to the bottom pole layer 8. The connecting layer 13 is made of a magnetic material.

Then, the write gap layer 9 and at least part of the magnetic pole portion of the bottom pole layer 8 located on the side of the write gap layer 9 are etched around the track width defining layer 12a, using the track width defining layer 12a as a mask. For example, reactive ion etching is used to etch the write gap layer 9, and ion milling is used to etch the bottom pole layer 8. The resultant structure as shown in FIG. 22B is called a trim structure, in which sidewalls of the magnetic pole portion of the top pole layer 12 (the end portion $12a_1$ of the track width defining layer 12a), the write gap layer 9 and at least part of the magnetic pole portion of the bottom pole layer 8 are formed vertically in a self-aligned manner.

Figures 23A, 23B:
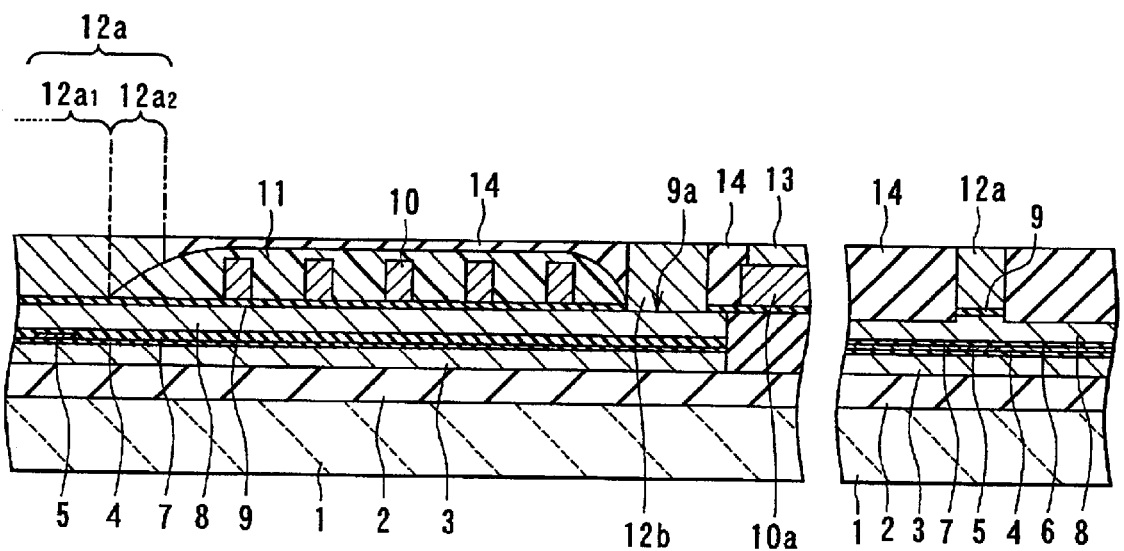
FIGS. 23A and 23B are cross sections for illustrating a step that follows FIGS. 22A and 22B.

Next, as shown in FIGS. 23A and 23B, an insulating layer 14 of an inorganic insulating material such as alumina is formed over the entire surface to a thickness of 3 to 4 μm, for example. The insulating layer 14 is then polished by chemical mechanical polishing, for example, so that the track width defining layer 12a, the coupling portion layer 12b and the connecting layer 13 are exposed, and the surface is flattened.

Figures 24A, 24B:
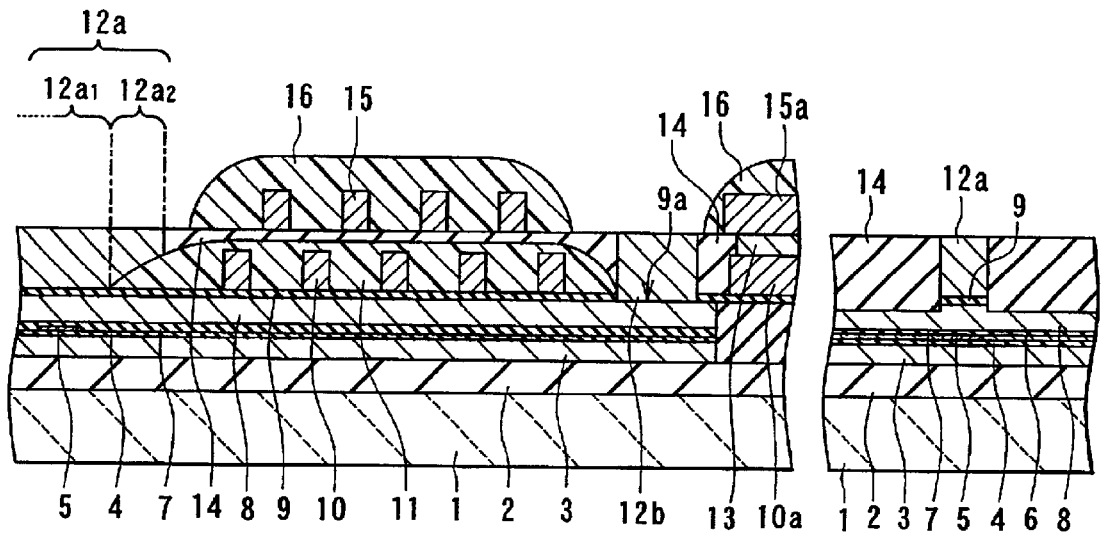
FIGS. 24A and 24B are cross sections for illustrating a step that follows FIGS. 23A and 23B.

Next, as shown in FIGS. 24A and 24B, the second layer 15 of the thin-film coil made of copper (Cu), for example, is formed on the flattened insulating layer 14 to a thickness of 2 to 3 μm, for example. In FIG. 24A, reference numeral 15a represents a connecting portion of the second layer 15 that is connected to the connecting portion 10a of the first layer 10 via the connecting layer 13. The second layer 15 is wound around the coupling portion layer 12b.

Next, an insulating layer 16 is formed in a predetermined pattern so as to cover the second layer 15 of the thin-film coil and the insulating layer 14 around the same. The insulating layer 16 is made of an organic insulating material which exhibits fluidity when heated, such as photoresist. Then, heat treatment is performed at a predetermined temperature to flatten the surface of the insulating layer 16. As a result of the heat treatment, each of the inner and outer circumferential ends of the insulating layer 16 has a rounded and inclined surface configuration.

Figures 25A, 25B:
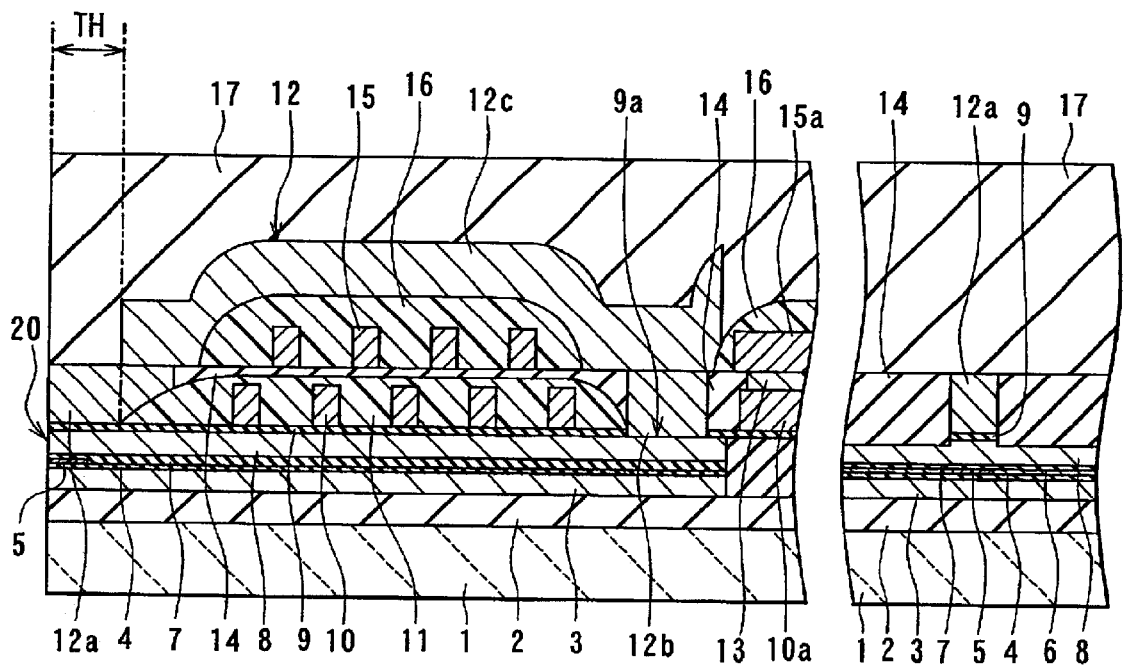
FIGS. 25A and 25B are cross sections for illustrating a step that follows FIGS. 24A and 24B.

Next, as shown in FIGS. 25A and 25B, the yoke portion layer 12c is formed on the track width defining layer 12a, the insulating layers 14 and 16 and the coupling portion layer 12b. The yoke portion layer 12c is made of a magnetic material used for making the write head, such as Permalloy, and constitutes a yoke portion of the top pole layer 12. An end of the yoke portion layer 12c facing the air bearing surface 20 is located at a distance from the air bearing surface 20. The yoke portion layer 12c is connected to the bottom pole layer 8 via the coupling portion layer 12b.

Then, an overcoat layer 17 of alumina, for example, is formed to cover the entire surface. Finally, machine processing of the slider including the foregoing layers is performed to form the air bearing surface 20 of the thin-film magnetic head including the write head and the read head, thereby completing the thin-film magnetic head.

The thin-film magnetic head thus fabricated comprises a medium facing surface (air bearing surface 20) that faces toward a recording medium, and the read head and the write head (induction-type electromagnetic transducer). The read head incorporates the GMR element 5, and the bottom shield layer 3 and the top shield layer (bottom pole layer 8) for shielding the GMR element 5. Portions of the bottom shield layer 3 and the top shield layer located on a side of the air bearing surface 20 are opposed to each other, the GMR element 5 being located between these portions.

The write head incorporates the bottom pole layer 8 and the top pole layer 12 magnetically coupled to each other, each of which includes at least one layer. The bottom pole layer 8 and the top pole layer 12 include the magnetic pole portions that are opposed to each other and located in regions of the pole layers on a side of the air bearing surface 20. The write head further incorporates the write gap layer 9 provided between the magnetic pole portions of the bottom and top pole layers 8 and 12, and the thin-film coil including the first and second layers 10 and 15, at least part of the coil being disposed between the bottom and top pole layers 8 and 12 and insulated from the bottom and top pole layers 8 and 12. In the thin-film magnetic head of the embodiment, as shown in FIG. 25A, the length from the air bearing surface 20 to the air-bearing-surface-side end of the insulating layer 11 is a throat height TH. The throat height is the length (height) of portions of the two pole layers facing each other with the write gap layer in between, from the air-bearing-surface-side end to the other end.

Figure 26:
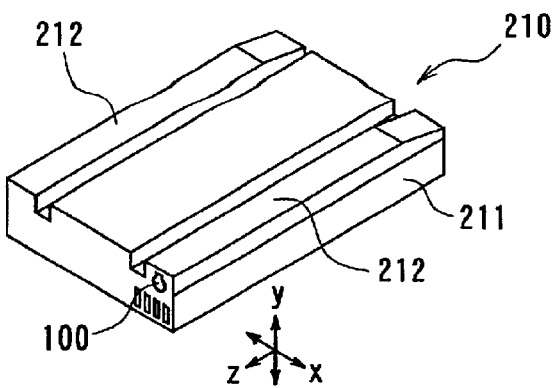
FIG. 26 is a perspective view that illustrates a slider incorporated in a head gimbal assembly of the embodiment of the invention.

A head gimbal assembly and a hard disk drive in which the thin-film magnetic head of the embodiment is used will now be described. First, with reference to FIG. 26, a slider 210 incorporated in the head gimbal assembly is described. In the hard disk drive, the slider 210 is placed to face toward a hard disk platter that is a circular-plate-shaped recording medium to be rotated and driven. The slider 210 has a base body 211 made up mainly of the substrate 1 and the overcoat layer 17 of FIGS. 25A and 25B. The base body 211 is nearly hexahedron-shaped. One of the six surfaces of the base body 211 faces toward the hard disk platter. Rails 212 are formed in this one of the surfaces. A surface of each of the rails 212 functions as the air bearing surface. A tapered portion or a stepped portion is formed near the air-inflow-side end (the end located at the upper right of FIG. 26) of each of the rails 212. When the hard disk platter rotates in the z direction of FIG. 26, an airflow goes into the tapered portion or stepped portion and passes between the hard disk platter and the slider 210. A lift is thus created below the slider 210 in the y direction of FIG. 26 by the airflow and is exerted on the slider 210. The slider 210 floats over the hard disk platter by means of the lift. The x direction of FIG. 26 is across the track of the hard disk platter. A thin-film magnetic head 100 of the embodiment is formed near the air-outflow-side end (the end located at the lower left of FIG. 26) of the slider 210.

Figure 27:
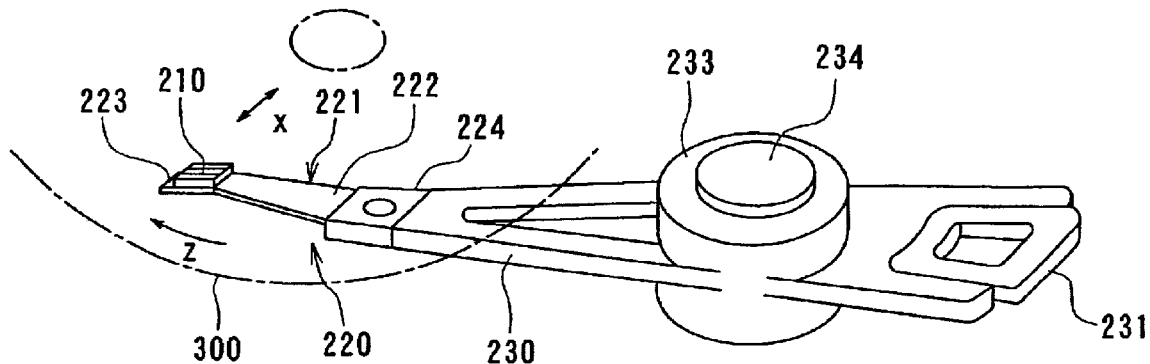
FIG. 27 is a perspective view that illustrates a head arm assembly including the head gimbal assembly of the embodiment of the invention.

Reference is now made to FIG. 27 to describe the head gimbal assembly 220 of the embodiment. The head gimbal assembly 220 comprises the slider 210 and a suspension 221 that flexibly supports the slider 210. The suspension 221 incorporates: a plate-spring-shaped load beam 222 made of stainless steel, for example; a flexure 223 to which the slider 210 is joined, the flexure being located at one end of the load beam 222 and giving an appropriate degree of freedom to the slider 210; and a base plate 224 located at the other end of the load beam 222. The base plate 224 is attached to an arm 230 of an actuator that moves the slider 210 along the x direction across the track of the hard disk platter 300. The actuator incorporates the arm 230 and a voice coil motor that drives the arm 230. A gimbal section that maintains the orientation of the slider 210 is provided in the portion of the flexure 223 on which the slider 210 is mounted.

The head gimbal assembly 220 is attached to the arm 230 of the actuator. An assembled body comprising the arm 230 and the head gimbal assembly 220 attached to the arm 230 is called a head arm assembly. An assembled body comprising a plurality of head gimbal assemblies 220 and a carriage with a plurality of arms is called a head stack assembly, in which the head gimbal assemblies 220 are each attached to the arms.

FIG. 27 illustrates an example of the head arm assembly. In the head arm assembly, the head gimbal assembly 220 is attached to one end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 28:
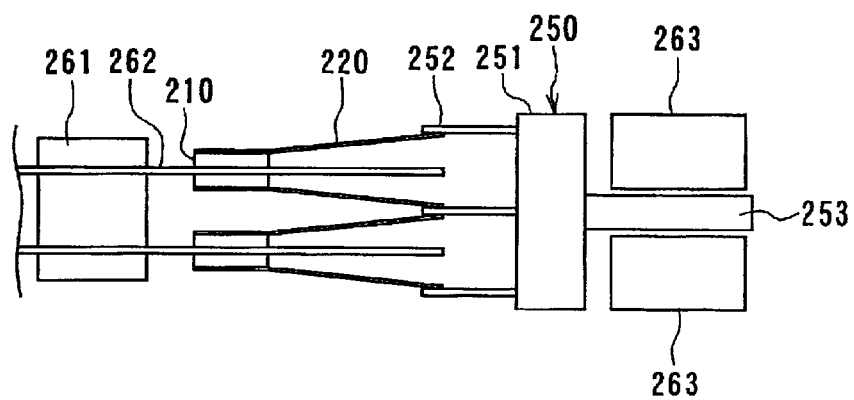
FIG. 28 illustrates a main part of a hard disk drive of the embodiment of the invention.
Figure 29:
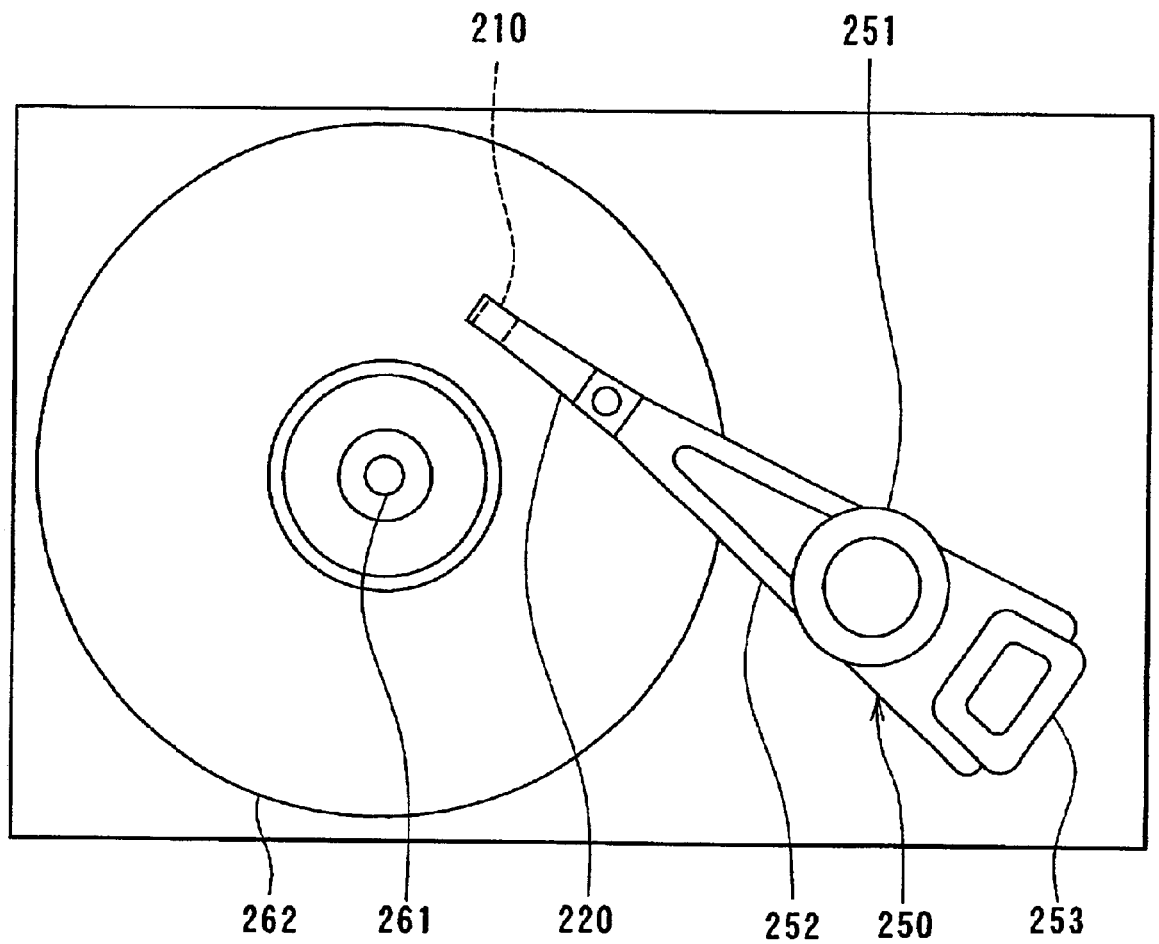
FIG. 29 is a top view of the hard disk drive of the embodiment of the invention.
Figure 30:
FIG. 30 is a cross section for illustrating a step in a method of forming a patterned thin film by means of etching through the use of an undercut mask.
Figure 31:
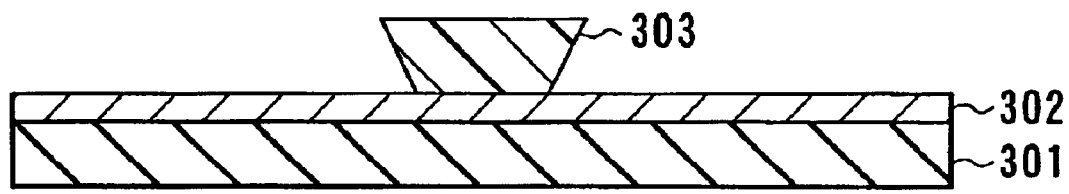
FIG. 31 is a cross section for illustrating a step that follows FIG. 30.
Figure 32:
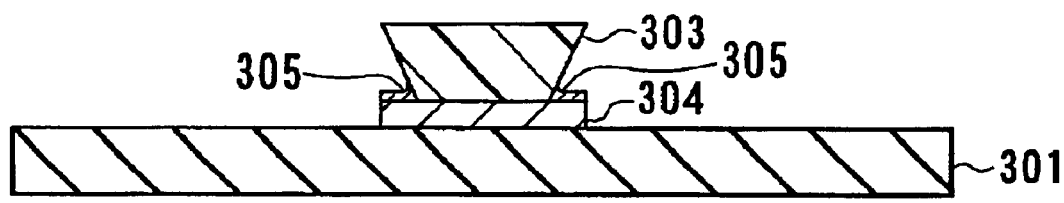
FIG. 32 is a cross section for illustrating a step that follows FIG. 31.
Figure 33:
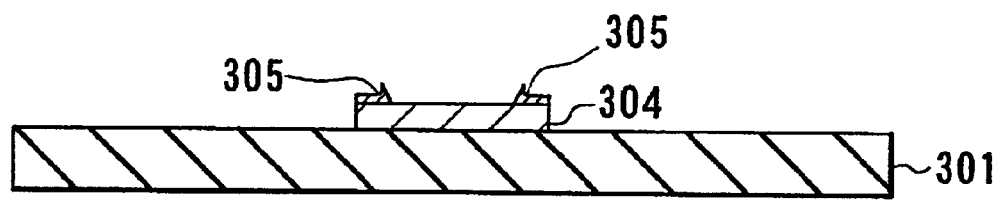
FIG. 33 is a cross section for illustrating a step that follows FIG. 32.
Figure 34:
FIG. 34 is a cross section for illustrating a step in a method of forming a patterned thin film by means of a combination method through the use of an undercut mask.
Figure 35:
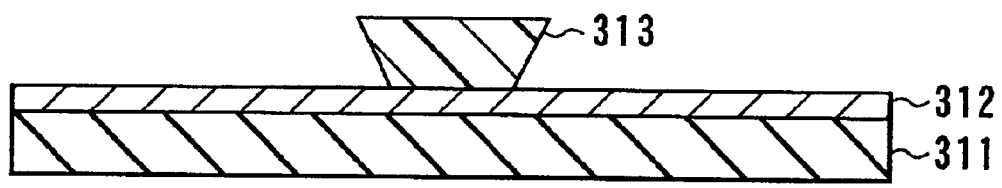
FIG. 35 is a cross section for illustrating a step that follows FIG. 34.
Figure 36:
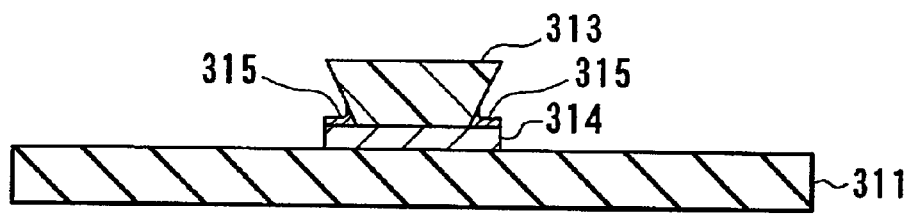
FIG. 36 is a cross section for illustrating a step that follows FIG. 35.
Figure 37:
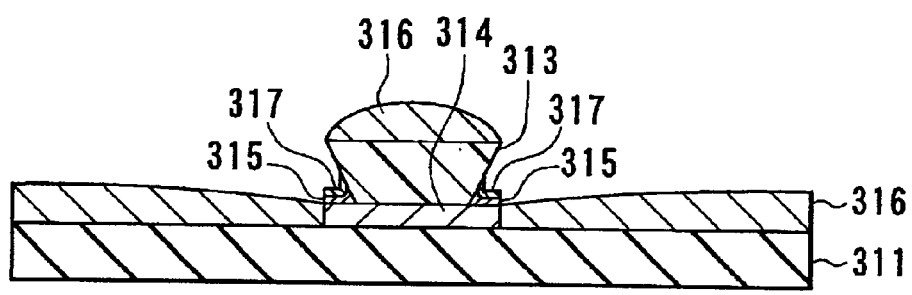
FIG. 37 is a cross section for illustrating a step that follows FIG. 36.
Figure 38:
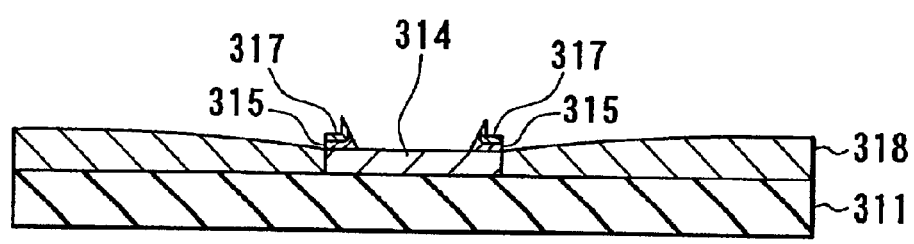
FIG. 38 is a cross section for illustrating a step that follows FIG. 37.

Reference is now made to FIGS. 28 and 29 to describe an example of the head stack assembly and the hard disk drive of the embodiment. FIG. 28 illustrates the main part of the hard disk drive. FIG. 29 is a top view of the hard disk drive. The head stack assembly 250 incorporates a carriage 251 having a plurality of arms 252. A plurality of head gimbal assemblies 220 are each attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the hard disk drive. The hard disk drive includes a plurality of hard disk platters 262 mounted on a spindle motor 261. Two of the sliders 210 are allocated to each of the platters 262, such that the two sliders 210 face each other with each of the platters 262 in between. The voice coil motor includes permanent magnets 263 located to face each other, the coil 253 of the head stack assembly 250 being placed between the magnets 263.

The head stack assembly 250 except the slider 210 and the actuator support the slider 210 and align it with respect to the hard disk platter 262.

In the hard disk drive of the embodiment, the actuator moves the slider 210 across the track of the hard disk platter 262 and aligns the slider 210 with respect to the platter 262. The thin-film magnetic head incorporated in the slider 210 writes data on the platter 262 through the use of the write head and reads data stored on the platter 262 through the use of the read head.

The present invention is not limited to the aforementioned embodiment but may be practiced in still other ways. For example, the invention is also applicable to a method of fabricating a micro device other than a thin-film magnetic head, such as a semiconductor device and a sensor or actuator incorporating a thin film.

As described above, in the method of forming a patterned thin film or the method of fabricating a micro device according to the invention, the peelable film is formed on the film to be patterned or on the first film to be patterned, and then the undercut mask is formed on the peelable film. During the selective etching of the film to be patterned or the first film to be patterned through the use of the mask, a substance that forms the film to be patterned or the first film to be patterned deposits to form the deposition film on the peelable film in the area around the bottom of the mask. On the other hand, during the formation of the second film to be patterned to cover the base layer and the mask, a substance for forming the second film to be patterned reaches the area around the bottom of the mask and deposits to form the deposition film on the peelable film in the area around the bottom of the mask. Those deposition films are removed together with the peelable film. Therefore, according to the invention, it is possible to form a patterned thin film using an undercut mask without causing defects.

Obviously many modifications and variations of the present invention are possible in the light of the above teachings. It is therefore to be understood that within the scope of the appended claims the invention may be practiced otherwise than as specifically described.

What is claimed is:

1. A method of forming a patterned thin film through the use of an undercut mask, comprising the steps of:

forming a film to be patterned on a base layer;

forming a peelable film on the film to be patterned, the peelable film to be patterned later with the film to be patterned, and to be eventually peeled off;

forming the undercut mask on the peelable film;

forming a patterned thin film from the film to be patterned, by patterning the film to be patterned and the peelable film by selective etching through the use of the undercut mask; and peeling off the undercut mask and the peelable film.

2. A method according to claim 1, wherein the peelable film is formed of a resin.

3. A method of forming a patterned thin film through the use of an undercut mask, comprising the steps of:

forming a first film to be patterned on a base layer;

forming a peelable film on the first film to be patterned, the peelable film to be patterned later with the first film to be patterned, and to be eventually peeled off;

forming the undercut mask on the peelable film;

forming a first patterned thin film from the first film to be patterned, by patterning the first film to be patterned and the peelable film by selective etching through the use of the undercut mask;

forming a second film to be patterned to cover the base layer and the undercut mask, to thereby form a second patterned thin film from the second film to be patterned on the base layer; and peeling off the undercut mask and the peelable film.

4. A method according to claim 3, wherein the peelable film is formed of a resin.

5. A method of fabricating a micro device including one or more patterned thin films, comprising the step of forming a patterned thin film through the use of an undercut mask, the step comprising the substeps of:

forming a film to be patterned on a base layer;

forming a peelable film on the film to be patterned, the peelable film to be patterned later with the film to be patterned, and to be eventually peeled off;

forming the undercut mask on the peelable film;

forming a patterned thin film from the film to be patterned, by patterning the film to be patterned and the peelable film by selective etching through the use of the undercut mask; and peeling off the undercut mask and the peelable film.

6. A method according to claim 5, wherein the peelable film is formed of a resin.

7. A method according to claim 5, wherein the micro device is a thin-film magnetic head.

8. A method according to claim 7, wherein the patterned thin film is a magnetoresistive element.

9. A method of fabricating a micro device including a plurality of patterned thin films, comprising the step of forming the patterned thin films through the use of an undercut mask, the step comprising the substeps of:

forming a first film to be patterned on a base layer;

forming a peelable film on the first film to be patterned, the peelable film to be patterned later with the first film to be patterned, and to be eventually peeled off;

forming the undercut mask on the peelable film;

forming a first patterned thin film from the first film to be patterned, by patterning the first film to be patterned and the peelable film by selective etching through the use of the undercut mask;

forming a second film to be patterned to cover the base layer and the undercut mask, to thereby form a second patterned thin film from the second film to be patterned on the base layer; and peeling off the undercut mask and the peelable film.

10. A method according to claim 9, wherein the peelable film is formed of a resin.

11. A method according to claim 9, wherein the micro device is a thin-film magnetic head.

12. A method according to claim 11, wherein the first patterned thin film is a magnetoresistive element.

* * * * *